United States Patent
Lee et al.

(10) Patent No.: US 10,991,722 B2
(45) Date of Patent: Apr. 27, 2021

(54) ULTRA LOW PARASITIC INDUCTANCE INTEGRATED CASCODE GAN DEVICES

(71) Applicant: International Business Machines Corporation, Armonk, NY (US)

(72) Inventors: Ko-Tao Lee, Yorktown Heights, NY (US); Xin Zhang, Yorktown Heights, NY (US); Todd E. Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/355,008

(22) Filed: Mar. 15, 2019

(65) Prior Publication Data
US 2020/0295045 A1  Sep. 17, 2020

(51) Int. Cl.
| | | |
|---|---|---|
| *H01L 27/12* | (2006.01) | |
| *H01L 29/78* | (2006.01) | |
| *H01L 21/84* | (2006.01) | |
| *H01L 29/04* | (2006.01) | |
| *H01L 29/778* | (2006.01) | |

(52) U.S. Cl.
CPC .......... *H01L 27/1203* (2013.01); *H01L 21/84* (2013.01); *H01L 29/045* (2013.01); *H01L 29/7786* (2013.01); *H01L 29/78* (2013.01)

(58) Field of Classification Search
CPC ............ H01L 27/0617; H01L 27/0629; H01L 27/0605; H01L 29/2003; H01L 29/66462; H01L 29/7786; H01L 29/7787; H01L 29/7783; H01L 29/866; H01L 29/872
See application file for complete search history.

(56) References Cited

U.S. PATENT DOCUMENTS

| | | |
|---|---|---|
| 7,501,670 B2 | 3/2009 | Murphy |
| 8,084,783 B2 | 12/2011 | Zhang |

(Continued)

OTHER PUBLICATIONS

Nishikawa, "GaN for automotive applications", 2013 IEEE Bipolar/BiCMOS Circuits and Technology Meeting (BCTM), Sep. 30-Oct. 3, 2013, Abstract only, 1 page.

(Continued)

*Primary Examiner* — Ermias T Woldegeorgis
(74) *Attorney, Agent, or Firm* — Scully, Scott, Murphy & Presser, P.C.; L. Jeffrey Kelly, Esq.

(57) ABSTRACT

One silicon MOSFET transistor, which is used as the $V_{Threshold}$ control, and a GaN power HEMT are integrated on a single die to enable a fully integrated depletion-mode power device. GaN area is created on a silicon substrate and GaN FETs are built in the GaN area. Outside of the GaN area, silicon transistors such as switch MOSFETs are built. Front end of line or back end of line metal connections are then made to create interconnections among the GaN FET and the silicon transistor. The short physical proximity of the silicon transistor and GaN HEMT significantly reduces the parasitic resistance and inductance between them. Thus, high speed signals are able to travel from the silicon transistor to the GaN HEMT with a higher frequency and lower distortion, without creating overshoot voltage when there is large parasitic inductance. Therefore, the cascode device can operate at a higher switching frequency.

18 Claims, 9 Drawing Sheets

(56) References Cited

U.S. PATENT DOCUMENTS

| | | | |
|---|---|---|---|
| 8,546,207 B2 | 10/2013 | Kittler et al. | |
| 9,406,674 B2 | 8/2016 | Briere | |
| 9,461,034 B2 | 10/2016 | Pan et al. | |
| 9,525,413 B2 | 12/2016 | Roberts et al. | |
| 9,960,157 B2 | 5/2018 | Prechtl et al. | |
| 10,050,034 B2 | 8/2018 | Rose et al. | |
| 2007/0241403 A1* | 10/2007 | Thean | H01L 21/8258 257/351 |
| 2010/0033237 A1 | 2/2010 | Liang et al. | |
| 2011/0210338 A1* | 9/2011 | Briere | H03K 17/567 257/76 |
| 2016/0225887 A1 | 8/2016 | Gallagher et al. | |
| 2016/0336313 A1 | 11/2016 | Jeon et al. | |
| 2019/0244955 A1 | 8/2019 | Zhang et al. | |

OTHER PUBLICATIONS

Watanabe, "GaN-on-Si Technology for High-power Transistors", NTT Technical Review, vol. 12, No. 4, Apr. 2014, pp. 1-6.

\* cited by examiner

ULTRA LOW PARASITIC INDUCTANCE INTEGRATED CASCODE GAN DEVICES

FIELD

The present application relates to cascode connected Gallium nitride (GaN) high electron mobility transistors (HEMTs) with an adjustable threshold voltage.

BACKGROUND

Gallium nitride (GaN) HEMTs are becoming increasingly useful as high-power devices for power electronics systems and RF systems. GaN HEMTs are used to enable high-power-density operation with low power loss due to high carrier mobility in the channel and high breakdown voltage due to large critical electric field. Since GaN HEMT is a majority carrier device, there is no reverse recovery charge thus GaN HEMTs further save power when the devices are switched on and off.

One technical challenge for GaN HEMTs is the threshold voltage ($V_{TH}$) is a negative voltage (depletion-mode) and very difficult to adjust. Among all the techniques, cascode connection is a circuit approach that can adjust $V_{TH}$ easily. Cascode connection includes one GaN HEMT and one Si transistor for $V_{TH}$ control. The only down side of cascode connection is most of the parasitic inductance and resistance are contributed by bonding wires between the GaN HEMT and the Si transistor, which degrade the system performance when a high frequency signal is being transferred between the control circuit and GaN devices. With the appearance of parasitic inductance, a pulse waveform will have a slower slope and a larger overshoot when it goes through the parasitic inductance.

SUMMARY

In one aspect there is provided an ultra low parasitic inductance integrated cascode GaN HEMT with adjustable threshold voltage ($V_{TH}$).

The ultra low parasitic inductance integrated cascode GaN HEMT includes a single silicon transistor, which is used as the $V_{TH}$ control, and a GaN power HEMT that are integrated on a single die to enable a fully integrated enhancement mode power device. The integrated silicon transistor and GaN HEMT are structured physically close to the GaN FETs. The short physical distance between the silicon transistor and the GaN HEMT significantly reduces the parasitic resistance and inductance between them.

GaN device area is created on a silicon-on-insulator substrate and GaN FETs are built in the GaN area. Outside of the GaN area, silicon transistors are built. By doing so, GaN FETs and silicon transistors are built on the same die. Front end of line or back end of line metal connections are then made to create interconnections among the GaN FET and the silicon transistor.

In accordance with a first aspect of the invention, there is provided a semiconductor structure. The semiconductor structure comprises: a single integrated circuit die formed on top a semiconductor-on-insulator substrate, the integrated circuit die comprising: a first field effect transistor (FET); and a second field effect transistor comprising a Group III nitride material, connected in cascode to the first transistor, the first transistor having a gate terminal receiving an input signal, the first transistor having a drain terminal driving a source terminal of the cascode connected second transistor, the second transistor having a drain terminal providing an output signal; and an integrated conductive structure formed at an interconnect layer above the semiconductor-on-insulator substrate for connecting the drain terminal of the first transistor to the source terminal of the integrated cascode connected second transistor; the conductive structure of a length configured to reduce a parasitic resistance and inductance between the first FET and cascode connected second FET.

In accordance with a further aspect of the invention, there is provided a method of forming a semiconductor structure. The method comprises: forming, within a single silicon die on top a semiconductor-on-insulator substrate, a first field effect transistor (FET); and forming, within the single silicon die, an adjacent second field effect transistor formed of a Group III nitride material, the second FET connected in cascode to the first transistor, the first transistor having a gate terminal receiving an input signal, the first transistor having a drain terminal driving a source terminal of the cascode connected second transistor, the second transistor having a drain terminal providing an output signal; and forming an integrated conductive structure at an interconnect layer above the first and second FET transistors formed in the single silicon die, the formed integrated conductive structure for connecting the drain terminal of the first transistor to the source terminal of the integrated cascode connected second transistor, wherein the conductive structure of a length configured to reduce a parasitic resistance and inductance between the first FET and cascode connected second FET.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
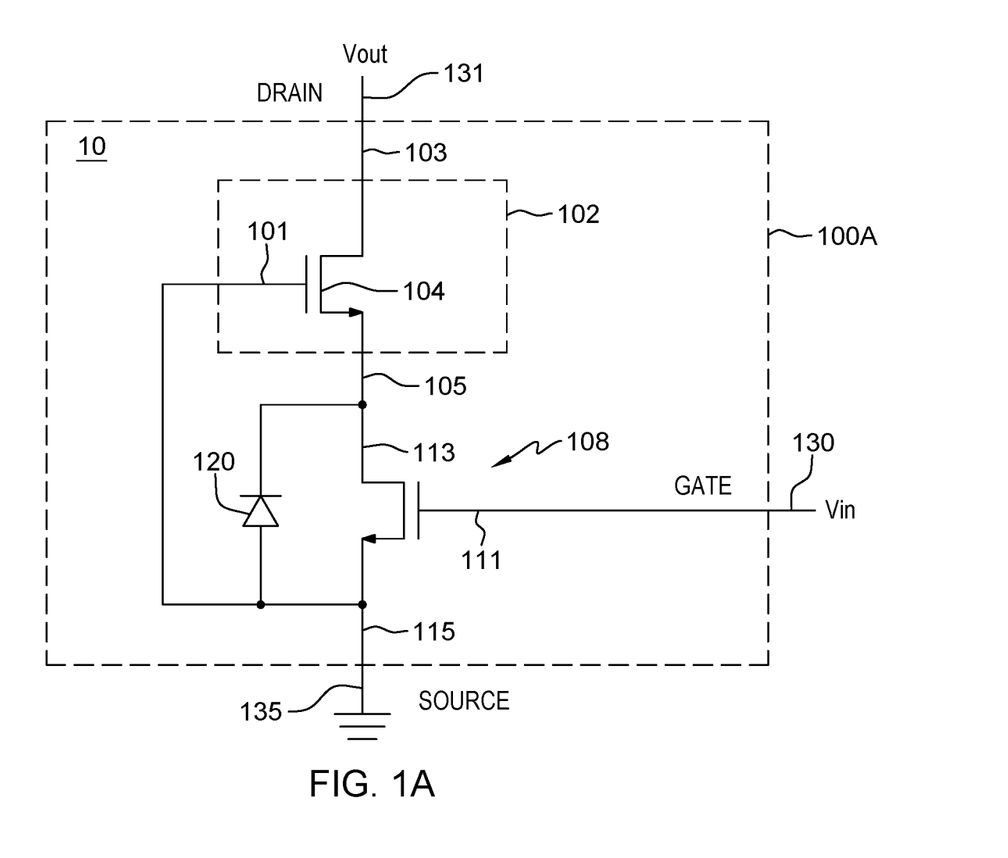
FIG. 1A is a circuit schematic depicting a first ultra low parasitic inductance cascode GaN structure integrated in a single integrated circuit chip die.

FIG. 1A is a circuit schematic depicting an ultra low parasitic inductance integrated cascode GaN device in a first embodiment of the invention. As shown in FIG. 1A, there is integrated on a silicon die 100A a cascode circuit device structure 10 having a single gate terminal 130, drain terminal 131 and source terminal 135. The cascode circuit device 10 includes a cascode power GaN HEMT device 102 driven by a connected and fully integrated transistor, i.e., a silicon Field Effect Transistor (FET), particularly a metal oxide semiconductor or MOSFET device 108. In an embodiment, the GaN HEMT device 102 is in a normally-ON state as characteristic of depletion-mode FET devices, and the Si MOSFET device 108 is in a normally-OFF state. As shown in FIG. 1A, the ultra low parasitic inductance integrated cascode GaN HEMT device 102 includes gate terminal 101, drain terminal 103 corresponding to cascode device drain terminal 131 and source terminal 105. Si MOSFET device 108 likewise includes gate terminal 111 corresponding to cascode device gate terminal 130, drain terminal 113 connected to the GaN HEMT device source terminal 105, and a source terminal 115 corresponding to cascode device source terminal 135. In an embodiment, the source terminal 115, which is the source 135 of the cascade device 10, is connected to a ground potential (e.g., 0 volts). The drain terminal 103 of the GaN device, which is the drain 131 of the cascade device 10, is the device output connection.

As shown in FIG. 1A, the ultra low parasitic inductance integrated cascode GaN device 10 is configured as a two-stage amplifier including an input stage MOSFET 108 that is configured as a common source stage and driven by signal source $V_{in}$ at gate terminal 130. This input stage then drives an output stage, e.g., GaN HEMT device 102 configured as a common gate amplifier with a device output signal at $V_{out}$.

As shown in FIG. 1A, the gate 101 of the GaN HEMT is electrically connected and shorted to the source 115 of the MOSFET 108. A parasitic voltage inherent in the channel of MOSFET device 108 is represented as a diode element 120 connecting the drain 113 of the Si MOSFET to the source terminal 115 of the Si MOSFET. Diode 120 represents a parasitic device inherent in the structure and depicts a cathode connected to the MOSFET drain terminal 113 and the anode connected to the Si MOSFET source terminal 115.

Thus, the gate-to-source voltage of the GaN HEMT is the source-to-drain voltage of the MOSFET device 108 thereby enabling the Si MOSFET 108 to control the turning on and off of the GaN HEMT 102.

Further, as known, the GaN HEMT device 102 is configured as a depletion-mode device having a channel 104 that is fully conductive with strong current flowing between the drain 103 and source 105 when the gate terminal 101 to source terminal 105 voltage is at zero volts (VGS=0V). An increasingly negative bias at the gate, e.g., given GaN HEMT 102 is an N-channel device, i.e., a channel having N+ dopant material, will reduce conduction in the channel 104, until finally—VGS (off)—the device's threshold voltage ($V_{TH}$) is reached, and conduction ceases.

Figure 1B:
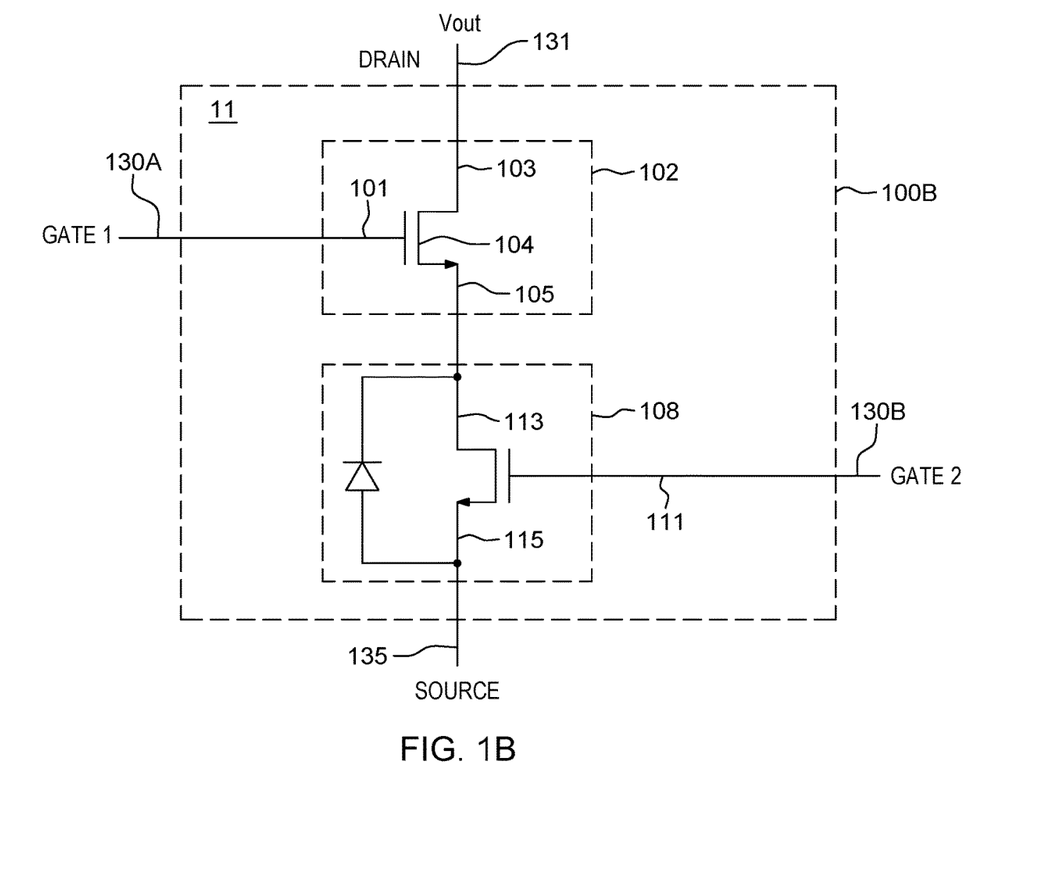
FIG. 1B is a circuit schematic depicting a second ultra low parasitic inductance cascode GaN structure integrated in a single integrated circuit chip die.

FIG. 1B is a circuit schematic depicting an ultra low parasitic inductance integrated cascode GaN device in a second embodiment of the invention. As shown in FIG. 1B, there is integrated on a single silicon die 100B a cascode circuit device structure 11 including two gate terminals 130A, 130B, drain terminal 131 and source terminal 135 as in the embodiment of FIG. 1A. The cascode circuit device 11 includes the cascode power GaN HEMT device 102 and the integrated MOSFET device 108. In an embodiment, the GaN HEMT device 102 is in a normally-ON state as characteristic of depletion-mode FET devices and is separately controlled via a signal applied at the gate 130A of the GaN HEMT device. The Si MOSFET device 108 is in a normally-OFF state and is separately controlled via voltage signal applied at the second gate 130B. As shown in FIG. 1B, the ultra low parasitic inductance integrated cascode GaN HEMT device 102 includes first gate terminal 130A, drain terminal 103 corresponding to cascode device drain terminal 131 and source terminal 105. Si MOSFET device 108 likewise includes gate terminal 111 corresponding to cascode device second gate terminal 130B, drain terminal 113 connected to the GaN HEMT device source terminal 105, and a source terminal 115 corresponding to cascode device source terminal 135.

FIG. 1B device 10 operates similarly as the embodiment shown in FIG. 1A in which the ultra low parasitic inductance integrated cascode GaN device 11 is configured as a two-stage amplifier including an input stage MOSFET 108 that is configured as a common source stage and driven by signal source $V_{in}$ at gate terminal 130B. This input stage then drives an output stage, e.g., GaN HEMT device 102 configured as a common gate amplifier simultaneously driven by a second signal at gate terminal 130A with an output signal at $V_{out}$.

As shown in FIG. 1B, a parasitic voltage inherent in the channel of MOSFET device 108 is represented as a diode element 120 connecting the drain 113 of the Si MOSFET to the source terminal 115 of the Si MOSFET. Diode 120 represents a parasitic device inherent in the structure and depicts a cathode connected to the MOSFET drain terminal 113 and the anode connected to the Si MOSFET source terminal 115.

In an embodiment, the integration of the cascode GaN HEMT 102 and Si MOSFET switch 108 forming cascode circuits 10, 11 on a single die (100A, 100B) as described herein, reduces parasitic inductance and capacitance between the silicon switch and the GaN HEMT and thus eliminates delay and oscillation during switching transients thereby enhancing electrical performance.

Figure 2A:
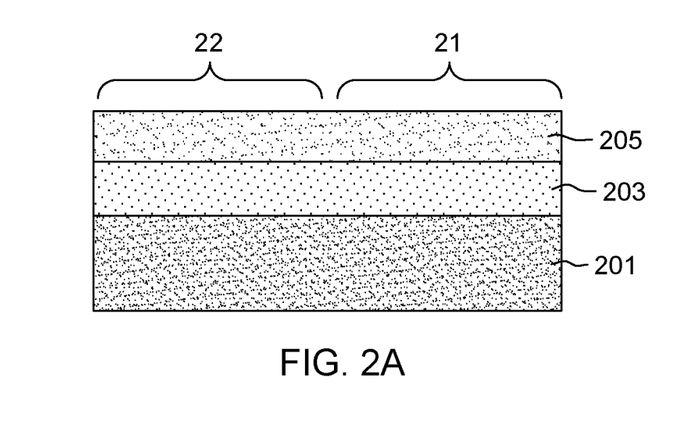
FIGS. 2A-2J depict the cross-sectional views of semiconductor manufacturing steps for manufacturing the ultra low parasitic inductance integrated cascode GaN device of FIGS. 1A-1B.

FIGS. 2A-2J depict a method for manufacturing the ultra low parasitic inductance integrated cascode GaN device 10, 11 of FIGS. 1A, 1B. As a result of the manufacturing steps depicted in FIGS. 2A-2J, the silicon MOSFET transistor 102 and GaN HEMT device 108 are now physically close. In particular, as shown in FIG. 2A the die area 21 having the GaN HEMT device is laterally adjacent an area 22 having the integrated Si MOSFET. The short physical distance of a conductive structure between the silicon MOSFET transistor 102 and the GaN HEMT 108, e.g., at an interconnect level, significantly reduces the parasitic resistance and inductance between them.

High speed signals are thus able to travel from the silicon MOSFET transistor 102 to the GaN HEMT device 108 with a higher frequency and lower distortion, without creating overshoot voltage when there is large parasitic inductance. Therefore the cascode device 10, 11 can operate at higher switching frequencies.

The small parasitic resistance and inductance between the silicon MOSFET transistor 108 and the GaN FET 102 also enables a faster turn-on/off speed, therefore a lower switching loss is achieved.

In particular, FIG. 2A shows a first step depicting the processing of a portion 21 of a single wafer (single die) in which the present ultra low parasitic inductance integrated cascode GaN device 10, 11 of FIG. 1A, 1B is built. As shown in FIG. 2A, the process starts with an semiconductor-on-insulator structure, e.g., a Silicon-on-Insulator wafer, having a bulk substrate layer, e.g., Silicon substrate 201, on top of which is formed a buried dielectric layer 203, e.g., an oxide, and which includes formed on top of the buried oxide, a further Silicon semiconductor layer 205. In an embodiment, the bulk Si substrate layer 201 has a (111) crystallographic surface orientation and is referred to herein as "a (111) silicon substrate" and the Si top layer 205 has a (100) crystallographic surface orientation and is referred to herein as "a (100) silicon layer". In embodiments, the thickness of the (111) silicon substrate ranges between 200 microns to 1500 microns; the thickness of the buried oxide layer 203 can range between 20 nm and 500 microns; and the thickness of the (100) silicon layer 205 can range between 20 nm and 500 microns, although lesser and greater thicknesses can also be employed.

In one embodiment, and as illustrated in the FIG. 2A, the (111) silicon substrate 201 may be a bulk semiconductor material having silicon located between a planar uppermost surface and a planar bottommost surface. In another embodiment, the (100) silicon layer 205 is a topmost layer of a silicon-on-insulator substrate. In such an embodiment, an insulator material such as, for example, a dielectric material such as $SiO_2$, can be located between the planar uppermost surface of the (111) silicon substrate and a planar bottommost surface of the (100) silicon layer. Silicon substrate layer may include a semiconductor material such as, for example, silicon, germanium, silicon germanium, a III-V compound semiconductor material or a II-V semiconductor material can be located beneath the insulator material of the silicon-on-insulator substrate. In yet another embodiment, the (100) silicon layer 205 can be a topmost layer of a multilayered stack of semiconductor materials. In still yet another embodiment, the (100) silicon layer 205 can be a topmost layer of a silicon-on-sapphire substrate.

Figure 2B:
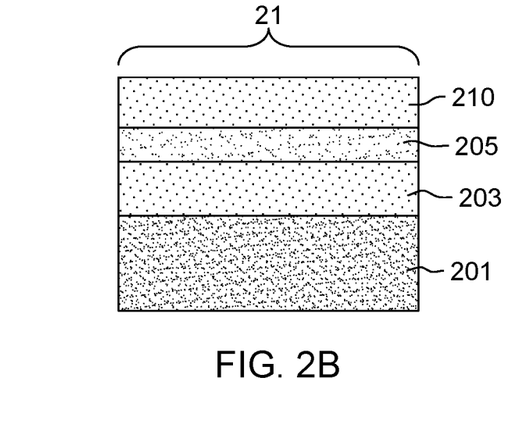

FIG. 2B shows a next method step in which the structure 10 of FIG. 1 is subject to a thermal oxidation step to oxidize the (100) silicon layer and form a top-most oxide layer 210 due to the thermal oxidation. In such an embodiment, the (100) silicon substrate 10 can be heated in an oxidizing (and/or nitriding) ambient at a temperature of 800° C. or greater. In another embodiment, a blanket layer of dielectric material 210 can be formed onto the uppermost surface of the (100) silicon layer 205 by utilizing a deposition process such as, for example, chemical vapor deposition, and plasma enhanced chemical vapor deposition. Notwithstanding which technique is used in forming the oxide layer 210, the oxide layer 210 typically has a thickness ranging from between 5 nm and 1000 nm although lesser and greater thicknesses can also be employed.

Figure 2C:
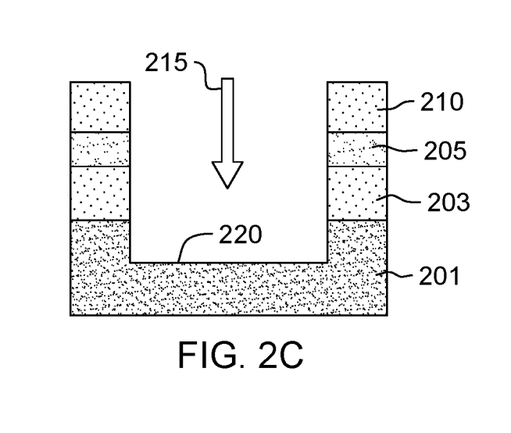

FIG. 2C shows an intermediate structure resulting from a next processing step that includes etching an area in which the GaN HEMT device 102 is to be formed. Performing the etch step shown in FIG. 2C involves lithography and etching wherein a blanket layer of a photoresist material (not shown) is deposited and lithographically patterned to from an opening (not shown) on the uppermost surface of the top-most oxide dielectric layer 210 in a lithographic step. The photoresist material layer is then exposed to radiation to develop the exposed photoresist material. The pattern of the opening in photoresist material layer is then transferred to the underlying dielectric 210 and silicon-on-insulator (SOI) substrate (201, 203, 205) by an anisotropic etch to form the trench 215. The etching step can include a dry etching process or a chemical wet etching process to from trench 215. When a dry etching process is employed, one of reactive ion etching (RIE), plasma etching, and ion beam etching can be used. When a chemical wet etch process is employed, a chemical etchant that selectively removes exposed portions of the oxide and underlying (100) Si layers is used. As shown in FIG. 2C, the formed trench 215 extends through the (100) silicon layer 205, the buried insulator layer 203 and partially into the (111) silicon substrate 201, exposing a sub-surface 220 of the (111) silicon substrate 201 which is located beneath the top surface of the (111) silicon substrate 201. By "sub-surface" it is meant a surface of a material that is located between a topmost surface and a bottommost surface of the same material. The depth of the trench 215 can be from 300 nm to 5 μm, although lesser and greater depths can also be employed.

After at least transferring the trench pattern to the SOI structure, any remaining photoresist material layer can be removed from the structure utilizing a conventional resist stripping process such as, for example, ashing.

Figure 2D:
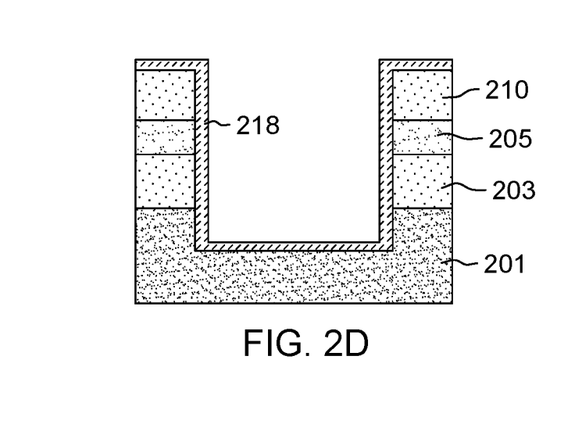

FIG. 2D illustrates a resulting structure of FIG. 2C after a method step of forming a conformal dielectric material liner 218 along the bottom and sidewall surfaces of the trench 215. The conformal material liner 218 may include a dielectric material that can effectively prevent Group III element from diffusing into (111) and (100) silicon layers 201, 203. In an embodiment, the dielectric material liner 218 includes a dielectric nitride such as, for example, silicon nitride (SiN). The dielectric material liner 218 can be formed utilizing a conformal deposition process such as, for example, chemical vapor deposition (CVD), plasma enhanced chemical vapor deposition (PECVD) or atomic layer deposition (ALD). By "conformal" it is meant that the deposition provides a film that defines a morphologically uneven interface with another body and has a thickness that is substantially the same (i.e., ±10 Angstroms) everywhere along the interface. The thickness of the dielectric material liner 218 can be from 5 nm to 100 nm, although lesser and greater thicknesses can also be employed.

Figure 2E:
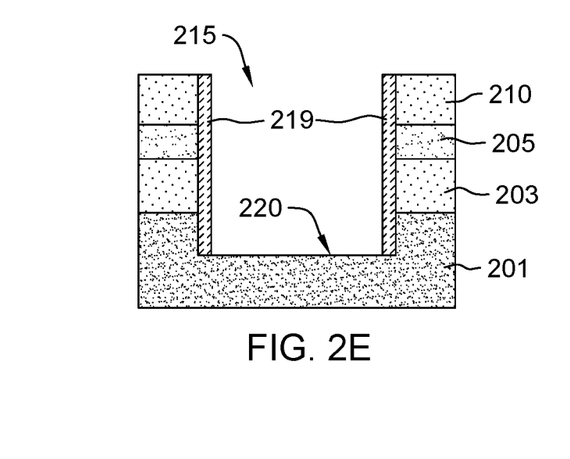

FIG. 2E illustrates a resulting structure of FIG. 2D after performing a further anisotropic etching step to remove a bottom horizontal portion of the formed SiN liner 218. In an embodiment, a reactive ion etch (RIE) is conducted in which a chemically reactive plasma removes the SiN material deposited only at the bottom of the trench in which high-energy ions from the plasma attack the SiN surface and react to remove it thereby exposing the sub-surface of the (111) silicon substrate at the bottom of the trench. As a result, SiN dielectric structures 219 remain as inner sidewalls of the etched structure 215.

Figure 2F:
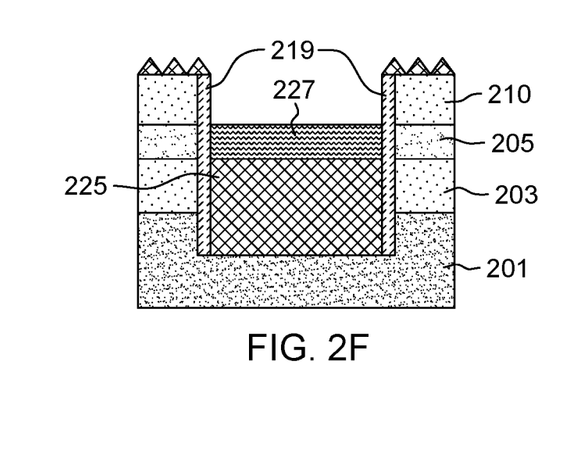

FIG. 2F illustrates a resulting structure of FIG. 2E after a further step of depositing GaN material used to form the Gan HEMT power device 102 within the trench 215. In particular, a Group III nitride buffer layer 225 is epitaxially grown from the sub-surface 220 of the (111) silicon layer 201 that is physically exposed at the bottom of the trench 215. The term "Group III nitride" as used throughout the present applicant denotes a compound that is composed of nitrogen and at least one element from Group III, i.e., aluminum (Al), gallium (Ga) and indium (In), of the Periodic Table of Elements. Illustrative examples of some common Group III nitride compounds are GaN, AlN, InN, GaInN, AlGaN, and GaAlInN. In one embodiment, the Group III nitride buffer layer 225 is composed of GaN. In another embodiment, the Group III nitride buffer layer 225 is composed of AlGaN. In an embodiment, a stack of multiple Group III nitride layers can be formed in trench 215 including, but not limited to, a GaN layer 225 and a AlGaN channel layer 227.

The Group III nitride buffer layer 225 may be formed by a selective epitaxial growth process. The selective epitaxial growth process grows the Group III nitride material that provides the Group III nitride buffer layer 225 only from the semiconductor surface such as exposed sub-surface 220 of the (111) silicon substrate 201, but not from the dielectric surface, such as sidewall surfaces of the sidewalls 219. In one embodiment, the Group III nitride buffer layer 225 may be formed, for example, by metal-organic chemical vapor deposition (MOCVD). The MOCVD process may include introducing a Group III-containing precursor and a nitride precursor into the reactor chamber of an MOCVD apparatus. In some embodiments, the Group III-containing precursor may be an organo-Group III containing compound, i.e., an organoaluminum compound, an organoindium compound, and/or an organogallium compound. In other embodiments, a Group III halide (typically a chloride) can be employed as the Group III-containing precursor. When an organo-Group III containing compound is employed, the Group III-containing precursor can be, for example, a trialkyl-Group III compound, wherein the alkyl contains from 1 to 6 carbon atoms. Examples of Group III compounds that can be employed in the present application, include, but are not limited to, trimethylaluminum, triethylaluminum, tributylaluminum, trimethylgallium, triethylgallium, tributylgallium, trimethylindium, triethylindium and tributylindium. Examples of nitride containing precursors that can be used include, for example, ammonium nitride.

An inert carrier gas may be present with one of the precursors used in forming the Group III nitride buffer layer 225, or an inert carrier gas can be present with both the precursors (i.e., Group III-containing precursor and a nitride precursor) used in forming the Group III nitride buffer layer 225. The deposition of the Group III nitride buffer layer 225 is typically performed at a temperature ranging from 700° C. to 1200° C. The thickness of the Group III nitride buffer layer 225 that is formed can be from 100 nm to 2 µm, although lesser and greater thicknesses can also be employed.

In some embodiments of the present application, the Group III nitride material that provides the Group III nitride buffer layer 225 can be deposited until it overfills the trench 215 (not shown). In such an embodiment, the overburdened Group III nitride material can be removed by first subjecting the overburdened Group III nitride material to a planarization process such as, for example, chemical mechanical polishing (CMP) and/or grinding, and thereafter a recess etch can be used to remove a topmost portion of the Group III nitride material within the trench 215 so as to provide the Group III nitride buffer layer 225. In another embodiment, a timed MOCVD process can be used in which the deposition only partially fills trench 215 with the Group III nitride material that provides the Group III nitride buffer layer 225.

As shown in FIG. 2F, a top surface of the Group III nitride buffer layer 225 is located at or below the top surface of the (100) silicon layer 203.

As further shown in FIG. 2F, a Group III nitride channel layer 227 is formed on the Group III nitride buffer layer 225. The Group III nitride channel layer 227 may include a Group III nitride material having a bandgap different from the Group III nitride material that provides the Group III nitride buffer layer 225. In one embodiment of the present application, the Group III nitride material that provides the Group III nitride channel layer 227 has a greater bandgap than the Group III nitride material that provides the Group III nitride buffer layer 225. In another embodiment of the present application, the Group III nitride material that provides the Group III nitride channel layer 227 has a lower bandgap than the Group III nitride material that provides the Group III nitride buffer layer 225. In one example, the Group III nitride channel layer 227 is comprised of AlGaN, while the Group III nitride buffer layer 225 is comprised GaN. The Group III nitride channel layer 227 can be formed by MOCVD as described above in forming the Group III nitride buffer layer 225. The top surface of the Group III nitride channel layer 227 can be formed above, coplanar with, or below the top surface of the (100) silicon layer 205. The formation of Group III nitride channel layer 227 is optional, and can be omitted in some embodiments of the present application.

In an embodiment, an area of the formed GaN MEMT device may range anywhere from between 25 µm² to 1 cm².

Figure 2G:
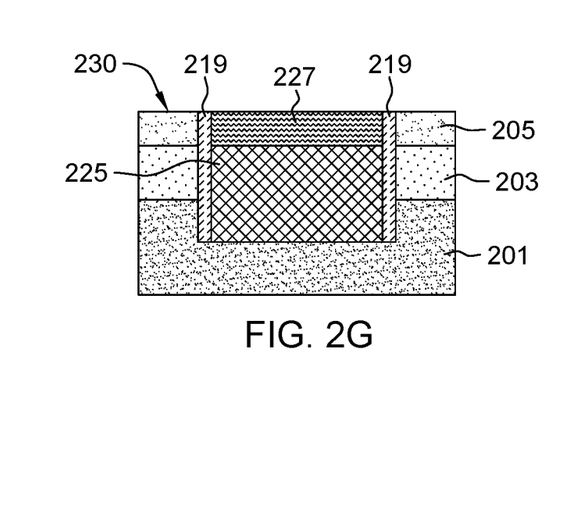
Figure 2H:
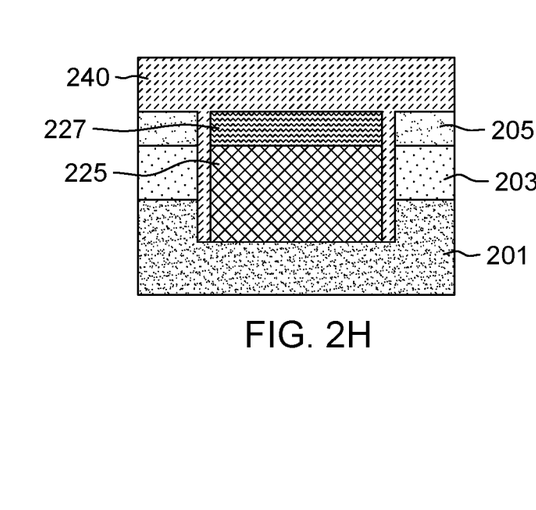

Referring to FIG. 2G, there is depicted a resulting structure in which, in an embodiment, the formed top-most oxide layer 210, formed by the thermal oxidation, and portions of the SiN nitride sidewalls 219 that are located above the top surface of the (100) silicon layer 205, are removed from the structure by subjecting the structure to a planarization process such as, for example, chemical mechanical polishing (CMP) and/or grinding. This results in a planarized top surface 230 of the sidewall spacers 219 being coplanar with the top surface 230 of the resulting GaN device. After planarization, the top surface of the Group III nitride channel layer 227 is coplanar with the top surface of the (100) silicon layer 205.

Figure 2I:
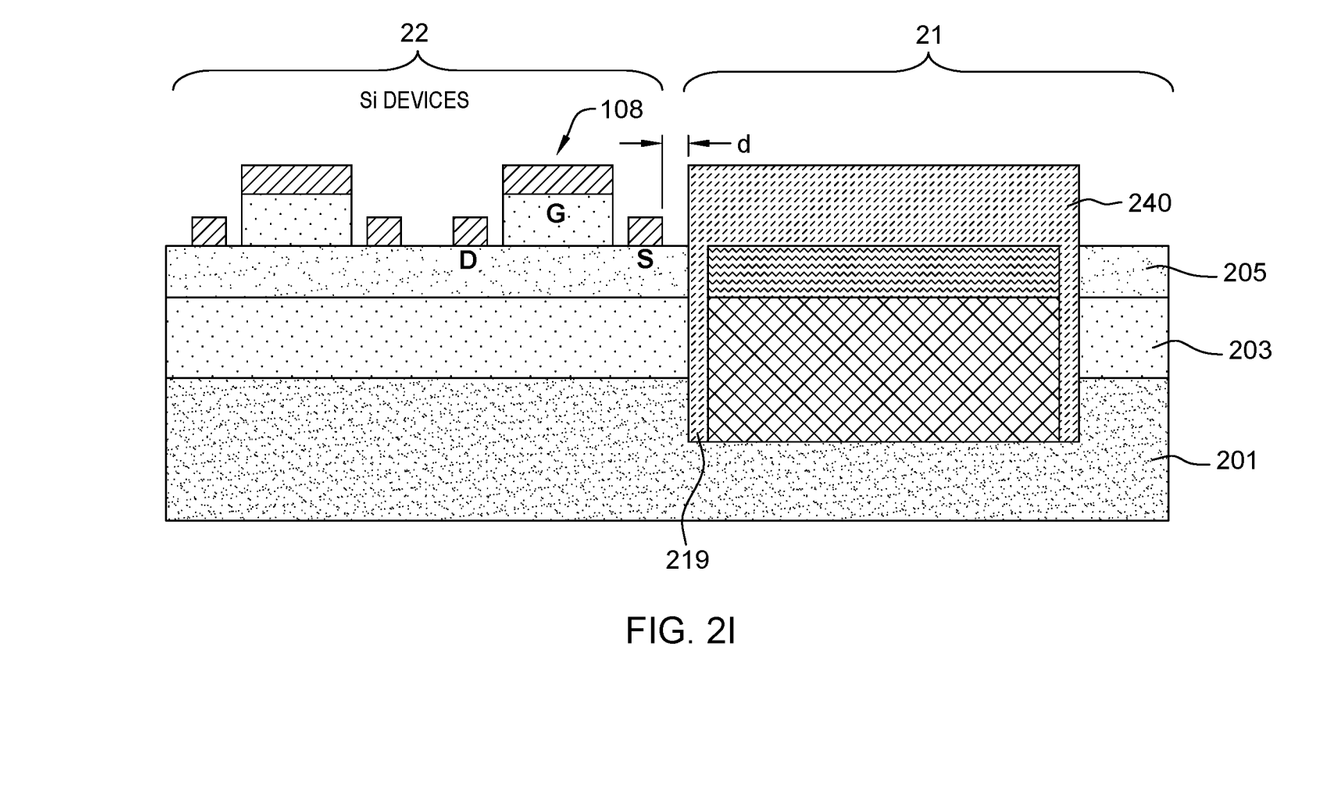
Figure 2J:
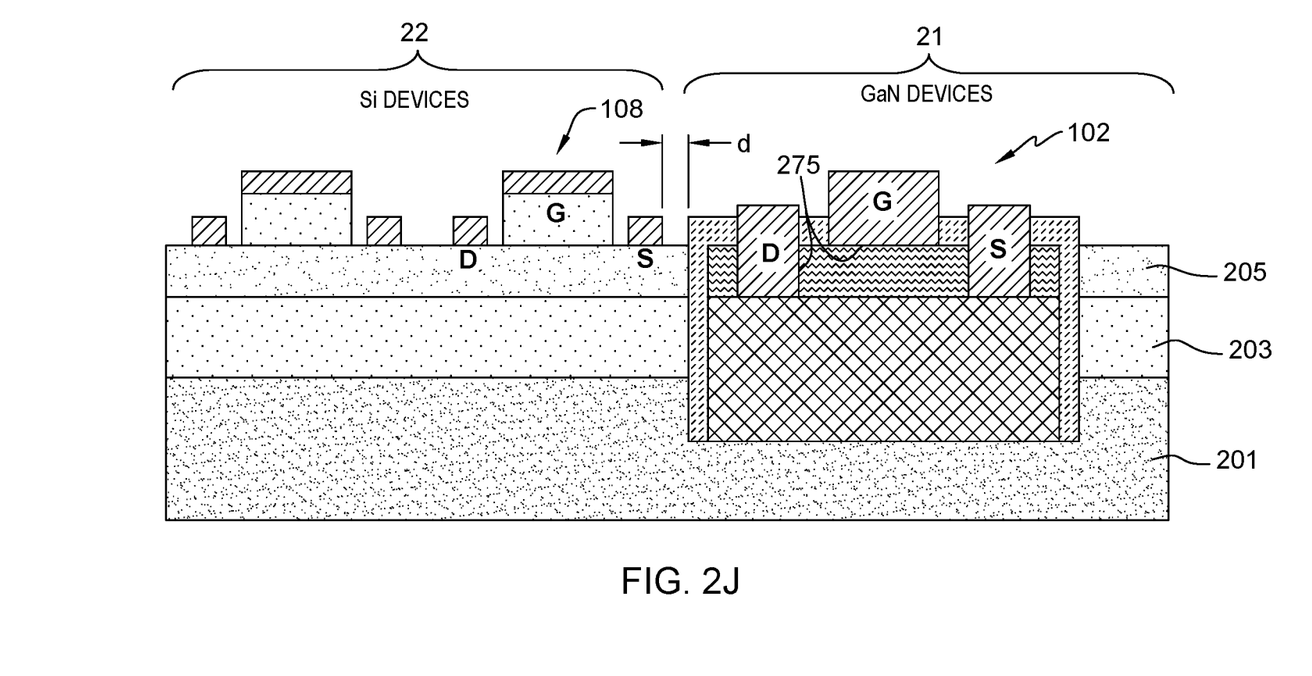

FIGS. 2I and 2J depict further fabrication steps for building the ultra low parasitic inductance integrated cascode GaN device 10 of FIG. 1A and cascode GaN device 11 of FIG. 1B.

Subsequently, conventional CMOS processing can be employed to form p-type and n-type FETs (not shown) in an adjacent proximate FET device region (i.e., where a physically exposed region of the (100) silicon layer 205 is located). Prior to forming the Si FETs in adjacent semiconductor die area, the wafer is capped with a dielectric material, e.g., SiN, to completely cover the surface 230 of resulting GaN device. In an embodiment, the wafer is capped with a dielectric SiN layer 240 having a thickness ranging between 50 nm and 5 µm for Si tools.

FIG. 2I shows the adjacent areas 21, 22 in the die and showing the result of forming transistor devices in integrated circuit die area 22, using conventional Si CMOS fabrication manufacturing techniques while the GaN HEMT device is capped by SiN layer 240. FIG. 2I particularly shows the forming of the Si MOSFET 108 including raised drain, gate and source terminals in the die cascode device area 22.

FIG. 2J shows the adjacent areas 21, 22 in the die and showing the result of forming GaN HEMT transistor device 102 in device area 21. Particularly, FIG. 2J shows a resulting structure after an etching of trenches 275 in portions of the SiN cap layer 240, and the filling of those trenches with conductive material to form respective gate, drain and source contact terminals in the etched trenches of the GaN HEMT device 102 in the die cascode device area 21.

Figure 3A:
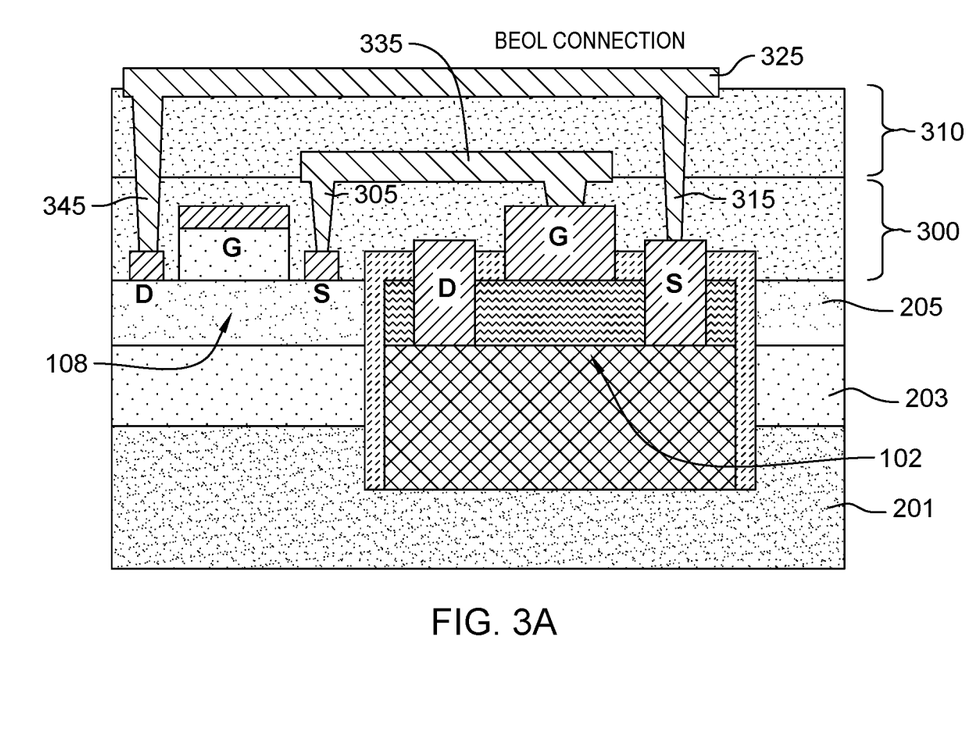
FIG. 3A is a cross sectional view of the exemplary semiconductor structure corresponding to the circuit of FIG. 1A.
Figure 3B:
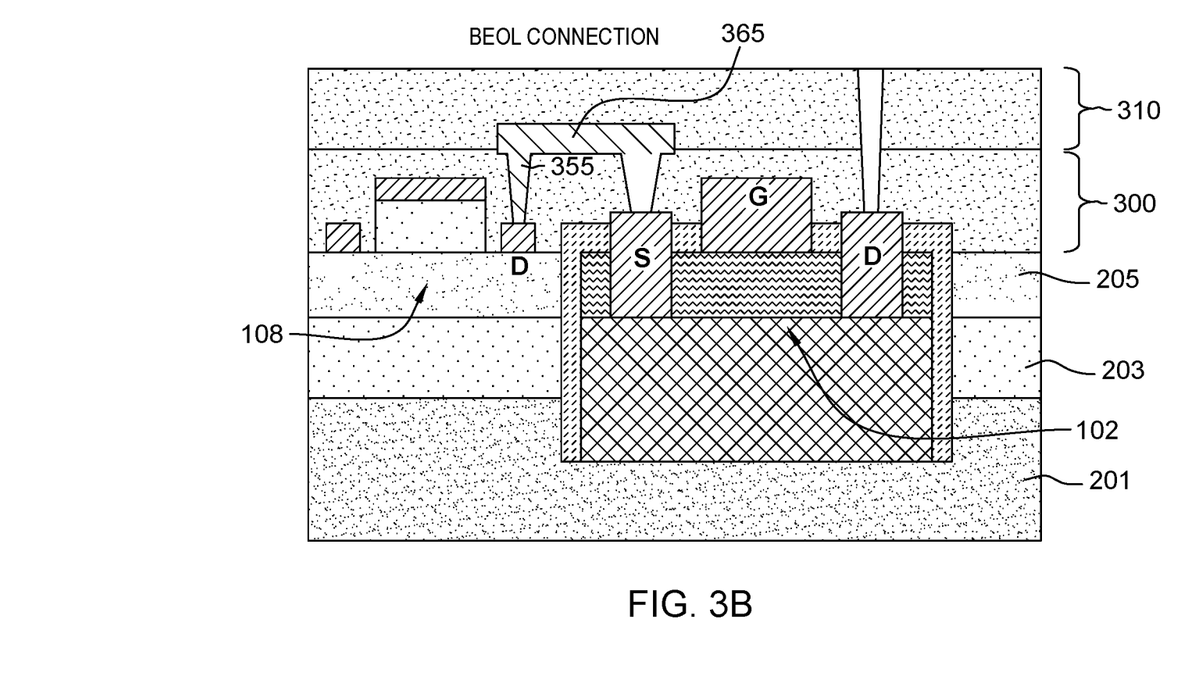
FIG. 3B is a cross sectional view of the exemplary semiconductor structure corresponding to the circuit of FIG. 1B.

FIG. 3A shows the resulting integrated circuit structure corresponding to the cascode amplifier 10 of FIG. 1A and FIG. 3B shows the resulting integrated circuit structure corresponding to the cascode amplifier 11 of FIG. 1B. In both embodiments, the GaN HEMTs and Si MOSFETs are fabricated on the same die (100A, 100B), and connected by a Back-End-Of-Line (BEOL) interconnect metallization level connection. Thus, any parasitic inductance between the GaN HEMT and the Si-MOSFET is reduced dramatically.

As shown in FIG. 3A, semiconductor BEOL manufacturing processes are implemented to deposit on the surface 230 of the die areas 21, 22 and particularly over the Si MOSFET 108 and GaN HEMT device 102, a first interlayer dielectric layer 300. Materials of dielectric layer 300 may include oxides (e.g., $SiO_2$), oxynitrides, organosilicate glass, or any other low-k material known as interlayer dielectric material for metal interconnect structures and may be deposited to a thickness ranging between, but not limited to 0.3 and 3.5 μm. Using damascene fabrication processing, trenches and/or vias 305 are formed through dielectric layer 300 that interface at the gate terminal location of the GaN HEMT 102 and likewise at the source location of the Si MOSFET 108. Further trenches 315, 345 are etched through dielectric layer 300. Each of these trenches are filled with conductive material, e.g., a metal such as Cu, to form respective device terminals. Further patterning, etching and metal deposition techniques are implemented to form a first interlayer (M1) metallization, e.g, a Cu metal conductor 335 connecting the gate terminal of the GaN HEMT device to the source terminal of the Si MOSFET.

A further second interlayer dielectric layer 310 is deposited on top of the first interlayer dielectric 300 and M1 metallization 335. Materials of dielectric layer 310 include oxides (e.g., $SiO_2$), oxynitrides, organosilicates, or any other low-k dielectric material and can be deposited to a thickness ranging between 0.3 and 4 μm.

Using damascene fabrication processing, further trenches connecting trenches 315, 345 are etched through dielectric layer 310 that interface at the source terminal conductor 315 at the GaN HEMT 102 and likewise at the drain terminal conductor 345 of the Si MOSFET 108. These further trenches are filled with conductive material and further patterning, etching and metal deposition techniques are implemented to form a second interlayer metallization level M2, e.g., a Cu metal conductor 325 connecting the formed source terminal of the GaN HEMT device to the formed drain terminal of the Si MOSFET to form cascode circuit 10 of FIG. 1A.

It should be understood that the conductive interlevel metallizations shown in FIGS. 3A, 3B are illustrative, and are not limiting. That is, the interlayer metallization, e.g., metal conductor 335 connecting the gate terminal of the GaN HEMT device to the source terminal of the Si MOSFET can be a M2 interlevel metal connection while the metal conductor 325 connecting the formed source terminal of the GaN HEMT device to the formed drain terminal of the Si MOSFET can be a M1 interlevel metal connection. One or more of these short physical metallization connections between the devices may be further embodied at an M3 metallization level (not shown).

As shown in FIG. 3B, the same semiconductor BEOL manufacturing processes are implemented to form the interlayer dielectric layers 300, 310 as in FIG. 3A. In the embodiment shown in FIG. 3B, the conductors for the separate gate terminals of each GaN and Si MOSFET device have not yet been formed. In particular, the connection to be formed at the gate terminal of the GaN device is to a signal source configured to operate the GaN device as a depletion-mode device and the connection to be formed at the gate terminal of the Si MOSFET device is to a different voltage source configured to operate the Si MOSFET device as an enhancement-mode device. As shown in FIG. 3B, using damascene fabrication processing, trenches 355 are formed through dielectric layer 300 that interface at the source terminal location at the GaN HEMT 102 and likewise at the drain terminal of the Si MOSFET. 108. These trenches are filled with conductive material, e.g., a metal such as copper, to form respective device contacts. Further patterning, etching and metal deposition techniques are implemented to form a first interlayer metallization, e.g., metal conductor 355 connecting the formed source terminal contact of the GaN HEMT device 102 to the formed drain terminal contact of the Si MOSFET 108 to form the cascode circuit 11 of FIG. 1B.

It should be understood that the conductive interlevel metallizations shown in FIGS. 3A, 3B are illustrative, and are not limiting. That is, for the structure shown in FIG. 3A, the interlayer metallization, e.g, metal conductor 335 connecting the gate terminal of the GaN HEMT device to the source terminal of the Si MOSFET can be a M2 interlevel metal connection while the metal conductor 325 connecting the formed source terminal of the GaN HEMT device to the formed drain terminal of the Si MOSFET can be a M1 interlevel metal connection.

Figure 4:
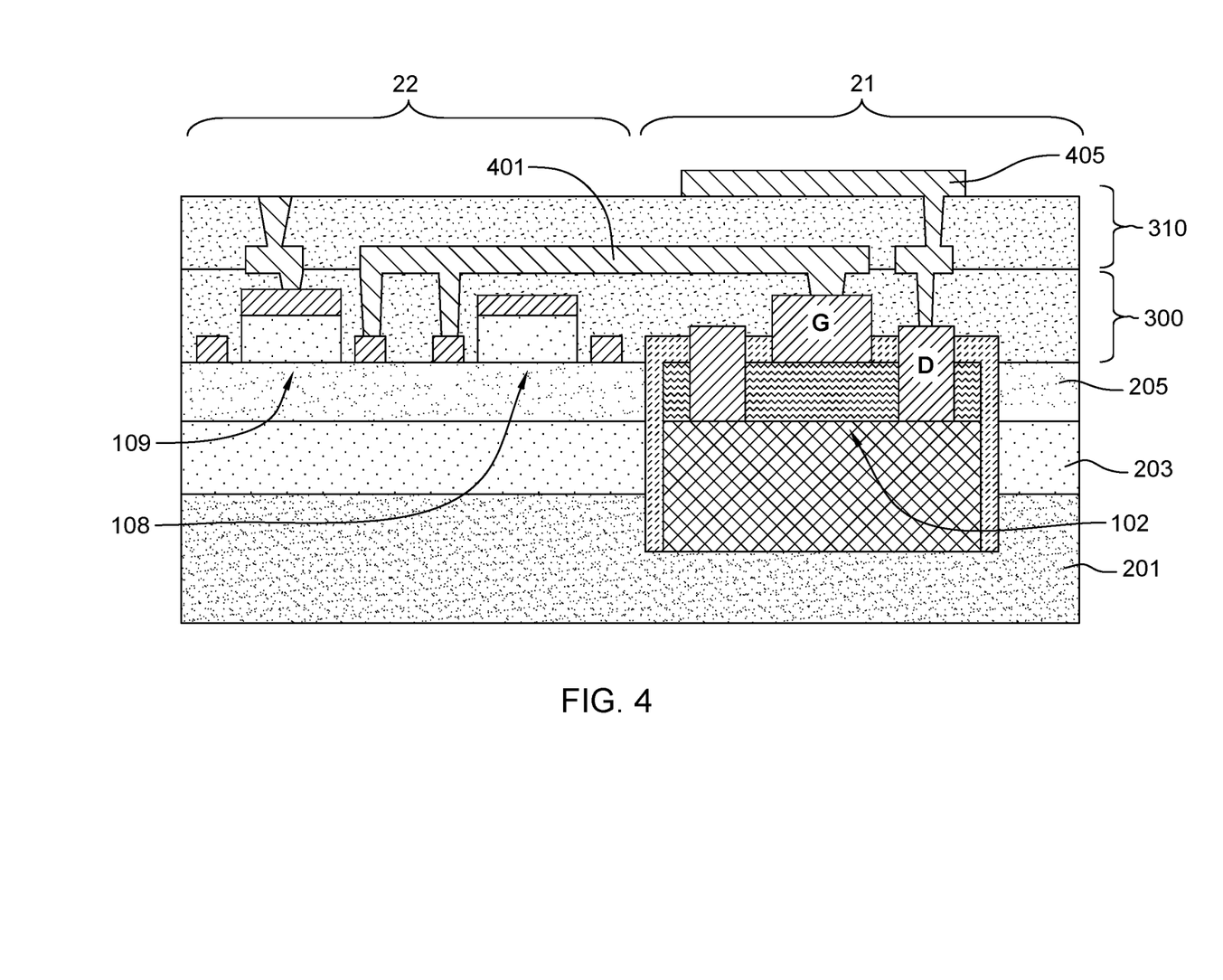
FIG. 4 shows a further cross-sectional view of a cascode connection of a GaN HEMT device to at least two Si MOSFET devices in the same Silicon die.

FIG. 4 shows a further cross-sectional view of a cascode connection of a GaN HEMT device to one or more Si MOSFET devices that can correspond to the fully integrated cascode circuits of FIGS. 1A, 1B. For example, the gate terminal of the GaN HEMT device 102 is shown connected to the source terminal of the Si MOSFET 108 via a interlevel metal connection 401 formed in the interlayer dielectric above the silicon die, and in addition, is connected to a further terminal, e.g., a drain terminal of a second Si MOSFET transistor 109 that provides a driving signal source (e.g., voltage signal) to the GaN device gate via the same metal connection 401. In a non-limiting embodiment, FIG. 4 shows results of damascene processes forming trenches and vias in dielectric layers 310, 300 that are filled with conductive material and brought up to the M2 metallization level 405 to connect the cascode GaN output at the drain to the M2 metallization level.

In each of the embodiments depicted in FIGS. 3A, 3B, 4, the silicon transistor and GaN HEMT are now physically close to the GaN FETs. In an embodiment, the short physical distance is a measure less than 1 mm and corresponds to the length of a metallization conductive structure at levels M1, M2 shown in FIGS. 3A, 3B. The short physical distance between the silicon transistor and the GaN HEMT significantly reduces the parasitic resistance and inductance between them.

For example, Table 1 below shows the reduction in parasitic inductance using the integrated approach in the embodiments of the invention. For example, using conventional manufacturing technique for the cascode in which the GaN HEMT and Si MOSFET are discrete devices connected by a conventional wire bonding, the first row of Table 1 shows the length of the connection between the GaN HEMT device and the Si MOSFET being reduced from 700 μm (using conventional bonding wire connections) compared to 0.5 μm in the fully integrated approach described herein shown in the second row of Table 1. Moreover, it is shown that the distance between this wire bond connection between the discrete GaN HEMT device and the Si MOSFET to a ground plane is reduced from 200~300 µm to about 2 µm in the fully integrated approach described herein shown in the second row of Table 1.

TABLE 1

| Device | Length of the connection | Wire to ground plane |
|---|---|---|
| Discrete GaN device | 700 µm | 200-300 µm |
| Fully-integrated GaN device | 0.5 µm | 2 µm |
| Reduction on parasitic inductance | X 1400 | X 2.6 |

In view of embodiments depicted in Table, 1, it is the case that for the length of bond wire ~700 µm in the conventional cascode configuration implementing discrete GaN and MOSFET devices, the parasitic inductance for the bond wire is 0.45 nH. For the fully-integrated GaN devices, the lateral distance is greatly reduced to less than 500 nm which results in an approximately 1400 times reduction between fully-integrated GaN device vs. discrete GaN and results in a parasitic inductance reduced to about 0.12 pH which is about a 3640 times reduction in parasitic inductance than the conventional discrete device configuration.

Similarly, in an embodiment, the distance between the bond wire and a ground plane in the conventional cascode circuit configuration is a large distance (e.g., 200~300 µm). For fully-integrated GaN-on-Si, the metal connection is implemented by the BEOL metallization (e.g., M1 level) which distance to the "ground", e.g., at the source terminal of the Si MOSFET, is much shorter (e.g., approximately 2 µm) resulting in a 2.6 times reduction (improvement).

Further, in an embodiment, the physical distance between the Si MOSFET and the GaN device is less than 1 mm or 2 mm. This is shown in the example structure shown in FIGS. 2I and 2J represented as a short distance "d" between the source (or drain) terminal of the Si MOSFET 108 and the SiN liner 219 of the GaN HEMT device 102. Given that the short physical distance between the silicon transistor and the GaN HEMT significantly reduces the parasitic resistance and inductance between them, high speed signals are able to travel from the silicon transistor to the GaN HEMT with a higher frequency and lower distortion, without creating overshoot voltage when there is large parasitic inductance. Therefore, the cascode device can work on a higher switching frequency.

The small parasitic resistance and inductance between the silicon transistor and the GaN FET also enables a faster turn-on/off speed, therefore a lower switching loss is achieved.

Advantageously, by integrating the silicon transistor and the GaN FET on a single die, the package size is much smaller than the conventional cascode connection, which has multiple chips in a package.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a single integrated circuit die formed on top a semiconductor-on-insulator substrate, the integrated circuit die comprising:
a first field effect transistor (FET); and
a second field effect transistor comprising a Group III nitride material connected in cascode to the first transistor, the second FET transistor having a first dielectric sidewall liner structure extending along a sidewall surface of said second field effect transistor and a second dielectric sidewall liner structure extending along an opposite sidewall surface of said second field effect transistor, said first and second sidewall liner structures insulating said second field effect transistor from said cascode connected first FET, the first transistor having a gate terminal receiving an input signal, the first transistor having a drain terminal driving a source terminal of the cascode connected second transistor, the second transistor having a drain terminal providing an output signal; and
an integrated conductive structure formed at an interconnect layer above said semiconductor-on-insulator substrate for connecting said drain terminal of said first transistor to the source terminal of said integrated cascode connected second transistor;
said conductive structure of a length configured to reduce a parasitic resistance and inductance between said first FET and cascode connected second FET, wherein said semiconductor-on-insulator substrate includes, from bottom to top, a (111) silicon layer, a buried insulator layer and a (100) silicon layer, the second FET transistor comprising: at least one Group III nitride material layer embedded within a trench that extends through the (100) silicon layer and the buried insulator layer and into an upper portion of the (111) silicon layer.

2. The semiconductor structure as claimed in claim 1, wherein said first FET transistor is a metal oxide semiconductor FET (MOSFET) in a normally off state and includes a channel of a polarity adapted for enhancement mode FET operation.

3. The method as claimed in claim 2, further comprising:
forming a further conductive structure at said one or more interconnect layers to connect a gate terminal of said cascode connected second transistor to a source terminal of said first transistor.

4. The method as claimed in claim 3, wherein the further conductive structure for connecting the gate terminal of said cascode connected second transistor to a source terminal of said first transistor includes forming a back-end-of-line (BEOL) metallization interlevel conductor at a single or multiple metallization interlevels.

5. The semiconductor structure as claimed in claim 1, wherein a further conductive structure formed at said one or more interconnect layers connects a gate terminal of said cascode connected second transistor to a source terminal of said first transistor.

6. The semiconductor structure as claimed in claim 1, wherein the integrated conductive structure for connecting said drain terminal of said first transistor to the source terminal of said integrated cascode connected second transistor is formed at a back-end-of-line (BEOL) metallization interlevel or combination of metallization interlevels.

7. The semiconductor structure as claimed in claim 5, wherein the further conductive structure for connecting the gate terminal of said cascode connected second transistor to a source terminal of said first transistor is formed at a back-end-of-line (BEOL) metallization interlevel or combination of metallization interlevels.

8. The semiconductor structure as claimed in claim 1, wherein the received input signal is a first input signal, a gate terminal of said cascode connected second transistor configured to receive a second input signal, different than said first input signal.

9. The semiconductor structure as claimed in claim 1, wherein said Group III nitride material includes material selected from GaN, AlN, InN, GaInN, AlGaN, and GaAlInN, said second FET transistor to be in a normally on state and includes a channel of a polarity adapted for a depletion mode FET operation.

10. The semiconductor structure of claim 1, wherein the at least one Group III nitride material is located atop a sub-surface of the (111) silicon layer.

11. The semiconductor structure of claim 1, wherein the at least one Group III nitride material layer has a topmost surface that is above, coplanar with, or below a top surface of the (100) silicon layer.

12. The semiconductor structure of claim 1, wherein the Group III nitride material layer comprises a Group III nitride buffer layer and a Group III nitride channel layer located on the Group III nitride buffer layer, wherein the Group III nitride channel layer has a top surface that is above, coplanar with, or below a top surface of the (100) silicon layer.

13. A method of forming a semiconductor structure comprising:
    forming, within a single silicon die on top a semiconductor-on-insulator substrate, a first field effect transistor (FET);
    forming, adjacent the first FET within the single silicon die, a trench;
    forming a first dielectric sidewall liner structure extending along a length of an interior sidewall surface of said trench and a second dielectric sidewall liner structure extending along a length of an opposing interior sidewall surface of said trench;
    forming, within the trench, between the first and second dielectric sidewall liner structures a second field effect transistor formed of a Group III nitride material, the second FET connected in cascode to the first transistor, the first transistor having a gate terminal receiving an input signal, the first transistor having a drain terminal driving a source terminal of the cascode connected second transistor, the second transistor having a drain terminal providing an output signal; and
    forming an integrated conductive structure at an interconnect layer above said first and second FET transistors formed in said single silicon die, said formed integrated conductive structure for connecting said drain terminal of said first transistor to the source terminal of said integrated cascode connected second transistor, wherein
    the first and second dielectric sidewalls insulate said second field effect transistor from said cascode connected first FET, and said conductive structure of a length configured to reduce a parasitic resistance and inductance between said first FET and cascode connected second FET wherein said forming within the single die an adjacent second FET transistor further comprises:
    forming the trench to extend through a (100) silicon layer and a buried insulator layer and into an upper portion of a (111) silicon layer of the semiconductor-on-insulator (SOI) substrate, and
    forming a Group III nitride buffer layer within the trench.

14. The method as claimed in claim 13, wherein the integrated conductive structure for connecting said drain terminal of said first transistor to the source terminal of said integrated cascode connected second transistor includes forming a back-end-of-line (BEOL) metallization interlevel conductor at a single or multiple metallization interlevels.

15. The method as claimed in claim 13, wherein the received input signal is a first input signal, a gate terminal of said cascode connected second transistor configured to receive a second input signal, different than said first input signal.

16. The method as claimed in claim 13, wherein said first FET transistor is a metal oxide semiconductor FET (MOSFET) in a normally off state and includes a channel of a polarity adapted for enhancement mode FET operation.

17. The method as claimed in claim 13, wherein said Group III nitride material includes material selected from GaN, AlN, InN, GaInN, AlGaN, and GaAlInN, said second FET transistor to be in a normally on state and includes a channel of a polarity adapted for a depletion mode FET operation.

18. The method of claim 13, wherein the forming the Group III nitride buffer layer comprises epitaxially growing a Group III nitride material from a sub-surface of the (111) silicon layer.

* * * * *